United States Patent
Boccato (10) Patent No.: US 9,873,217 B2
(45) Date of Patent: Jan. 23, 2018

(54) APPARATUS AND A PROCESS FOR PRODUCING CONNECTING CABLES

(75) Inventor: Enrico Boccato, Castel Bolognese (IT)

(73) Assignee: CURTI COSTRUZIONI MECCANICHE S.P.A., Castel Bolognese (RA) (IT)

(*) Notice: Subject to any disclaimer, the term of this patent is extended or adjusted under 35 U.S.C. 154(b) by 1613 days.

(21) Appl. No.: 14/344,232

(22) PCT Filed: Dec. 24, 2009

(86) PCT No.: PCT/IT2009/000578
§ 371 (c)(1),
(2), (4) Date: Mar. 11, 2014

(87) PCT Pub. No.: WO2011/077467
PCT Pub. Date: Jun. 30, 2011

(65) Prior Publication Data
US 2014/0326500 A1 Nov. 6, 2014

(51) Int. Cl.
*B29C 45/14* (2006.01)
*H02G 15/08* (2006.01)
(Continued)

(52) U.S. Cl.
CPC .... B29C 45/14467 (2013.01); B29C 45/0053 (2013.01); B29C 45/045 (2013.01);
(Continued)

(58) Field of Classification Search
CPC ........ B29C 45/14467; B29C 45/14639; B29C 45/14008; B29C 45/045; B29C 45/0053;
(Continued)

(56) References Cited

U.S. PATENT DOCUMENTS 3,617,876 A * 11/1971 Robinson .......... B29C 45/14639
249/97
3,668,779 A * 6/1972 Turner ................... H01R 24/28
264/263
(Continued)

FOREIGN PATENT DOCUMENTS

DE 200 10 625 9/2000
EP 0 517 031 A2 5/1992
(Continued)

OTHER PUBLICATIONS

International Search Report dated Nov. 23, 2010.
International Preliminary Report on Patentability with Written Opinion dated Jun. 26, 2012.

*Primary Examiner* — Nahida Sultana
(74) *Attorney, Agent, or Firm* — Nixon & Vanderhye P.C.

(57) ABSTRACT

An apparatus for manufacturing the ends of electric cables, which comprises a section for injection molding on at least one end, a first section comprising means for applying electrical connection elements to one end of the cable and, optionally, a second section for applying further electrical connection elements to the remaining end of the cable, and means for testing the cable prior to its output from the apparatus, in which retaining means for both ends of the cables in all the manufacturing sections and means for moving said ends from the retaining means of one section to the retaining means of the next section are also present. The molding section comprises a plurality of molds, with an injector for each mold, mounted on platform with which they can be rotated along a circumference.

12 Claims, 7 Drawing Sheets

(51) Int. Cl.
*H02G 15/013* (2006.01)
*B29C 45/00* (2006.01)
*B29C 45/04* (2006.01)
*B29C 45/08* (2006.01)
*H01R 43/24* (2006.01)
*B29L 31/30* (2006.01)
*G01R 31/02* (2006.01)

(52) U.S. Cl.
CPC ........ *B29C 45/08* (2013.01); *B29C 45/14008* (2013.01); *B29C 45/14639* (2013.01); *H01R 43/24* (2013.01); *H02G 15/013* (2013.01); *H02G 15/08* (2013.01); *B29L 2031/3061* (2013.01); *G01R 31/021* (2013.01)

(58) Field of Classification Search
CPC ...... B29C 45/08; H02G 15/013; H02G 15/08; H01R 43/24; G01R 31/021; B29L 2031/3061
See application file for complete search history.

(56) References Cited

U.S. PATENT DOCUMENTS

| | | | |
|---|---|---|---|
| 4,411,608 A | | 10/1983 | Yanagisawa |
| 5,208,977 A | | 5/1993 | Ricard |
| 5,226,218 A | | 7/1993 | Wiemeyer et al. |
| 5,281,123 A | | 1/1994 | Hoffmann et al. |
| 5,371,931 A | * | 12/1994 | Kawana ............. B29C 37/00 29/33 K |
| 5,681,596 A | * | 10/1997 | Mills ................. B29C 33/20 425/451.6 |
| 6,241,508 B1 | * | 6/2001 | John ................. B29C 45/125 425/451.7 |
| 6,637,496 B1 | | 10/2003 | Macheske et al. |
| 2008/0174048 A1 | | 7/2008 | Boyd et al. |
| 2008/0251974 A1 | | 10/2008 | Simone |

FOREIGN PATENT DOCUMENTS

| | | |
|---|---|---|
| GB | 2 067 127 | 7/1981 |
| JP | 2-131911 | 5/1990 |

\* cited by examiner

APPARATUS AND A PROCESS FOR PRODUCING CONNECTING CABLES

This application is the U.S. national phase of International Application No. PCT/IT2009/000578 filed 24 Dec. 2009 which designated the U.S., the entire contents of which is hereby incorporated by reference.

FIELD OF INVENTION

The present invention concerns an apparatus for the manufacture of connection cables. More in particular the present invention relates to an apparatus and process for the manufacture and overmoulding of connection elements at least one end of lengths of flexible electric cables having at least one connection end.

BACKGROUND OF THE INVENTION

In the present description, the term connection cables is intended as indicating cables, electric cables in particular, fitted with connection means at one or both ends, electrical connections in particular, and with at least one of the two ends fitted with a portion in a thermoplastic material obtained by overmoulding the end itself. In the following description, for simplicity of exposition, reference will only be made to electric cables.

The term overmoulding is intended as the process that provides to place an end of the cable, in general fitted with means of electrical connection, inside an injection mould and to inject thermoplastic material into the mould to cover part of the means of connection in correspondence to said end, in order to allow them to be used safely or to make geometric shapes for fastening them, as in a cable gland for example.

For example, in the manufacture of a plug on electric cables the metal elements that constitute the contacts of the plug and form the insert are connected to the electrical wires of the cable and then overmoulded with a thermoplastic material that allows the insert to be kept in the desired position and gives the plug its external shape and final functionality.

In particular, the apparatus according to the present invention relates to the moulding of connectors, plugs and similar elements over the ends of electric cables.

The invention also relates to a particular injection moulding press suitable for overmoulding connection cable ends as defined above.

There are apparatuses known in the art for manufacturing the ends of electric cables that envisage means for fastening electrical connection portions to the ends of the cables and injection presses for overmoulding one or both ends of the cable. These presses are provided with a mould equipped with a plurality of cavities, or impressions, in which the ends of a corresponding plurality of cables are inserted for injection over moulding. In other words, apparatuses in conventional systems have large moulds with a high number of impressions, where a corresponding number of ends of electric cables fitted with electrical connection elements are inserted. The thermoplastic material is injected over these ends to form, for example, a plug or a socket.

On these presses, the end of the cable to be processed is usually inserted by hand and, after injection of the material and its solidification, the removal of cables from the mould and testing of the overmoulded cables are also carried out manually, to the detriment of speed and efficiency in the production process.

Apparatuses are also known wherein the loading of the cable heads to overmould and the discharge of the overmoulded cables is carried out automatically, but said apparatuses still do not allow all tests on the finished product to be carried out during the manufacturing steps, to the detriment of the product quality.

The testing step consists in checking that the end of the cable has not moved during the pressurized injection of the thermoplastic material into the mould with consequent emergence of the insert, or part of the cable, from the solidified thermoplastic material. The movement of the insert or the cable itself inside the mould can also cause the total or partial loss of the connection between the conductor wires inside the cable and the overmoulded connection element, making it useless; for this reason, an electrical test is also carried out on the cable, putting it in similar conditions to those of carrying current when powering a domestic appliance, to check its correct operation.

This is carried out by connecting both ends of the cable's individual conductors to a current generator to check if the electrical circuit closes and so confirm the functionality of the cable and the connectors and/or plugs and sockets that have been overmoulded on its ends.

A drawback of known apparatuses is the impossibility of performing this test automatically and without interrupting the production cycle.

A further drawback of known apparatuses is the great difficulty or substantial impossibility of processing the two cable ends together: in fact, in said apparatuses, because of balancing and correct filling requirements of the mould shapes, as a rule it is not possible to inject the same material in cavities having mutually different sizes and geometry. In this case, it is necessary to first mould the first end of the cables and afterwards, by means of a second mould, moulding the second end.

OBJECT OF THE INVENTION

The need therefore arises to provide an apparatus and a manufacturing process that solve the above-discussed problems and reduce the costs and times for the manufacture of electric cables.

The aim of the present invention is to provide an apparatus and a process for the manufacture of electric cables by the overmoulding of at least one end of elongated and flexible elements, in particular for carrying out the overmoulding of plugs, sockets, connectors and suchlike on the ends of electric cables, that overcomes the problems of the known art and in which all the steps of production of the flexible elements can be carried out continuously and without interruption.

In particular, one aim of the present invention is that of providing an apparatus and a process in which the steps of preparation of the end of the cable, moulding and subsequent testing are carried out in a continuous and automatic manner, i.e. without the need to group the cable heads to overmould them and without the need to single out the overmoulded cables one by one to allow subsequent testing.

SUMMARY OF THE INVENTION

These aims are achieved by present invention, which concerns an apparatus and a process for manufacturing the ends of electric cables, with a press.

In the apparatus according to the invention, the ends of the cable being manufactured are kept in a certain and known position (a preset position) by means of dedicated retaining means during all the steps of production and in all the stations of the apparatus, from preparation of the end, during moulding and during final testing. The term "certain and known position" is intended to indicate the fact that during the various steps of manufacturing of the cable, the two cable ends are always engaged by their retaining means; in particular, during the injection moulding step, one end is held in the mould and the other end of the cable is held by a gripper or similar retaining means, such that the two ends are in known positions and can be collected by means of handling and both moved from the moulding station to successive stations for processing and then testing.

According to a preferred embodiment, the apparatus comprises a rotating injection press fitted with single-impression moulds, each one equipped with its own injector that turns with the mould by means of a rotatable platform.

According to a further aspect of the invention, the mould comprises two half-moulds, constrained and sliding on guides fixed to said rotatable platform and divergently oriented from each other towards the outside of the platform to perform the opening and closing of said mould following the translation of the half-moulds along the guides.

In this configuration, the mould also comprises a transport element for the two half-moulds, which in turn has means for locking itself in the moulding position, namely beneath the injector. The transport element envisages the presence of retaining means for the end of the cable inside the closed mould, and therefore, a portion of said transport element forms part of the wall of the cavity of the mould itself.

According to a further aspect of the invention, the injector comprises a plasticization cylinder, an injection cylinder, an injection screw and a control motor for said injection screw, all said components being arranged coaxially with respect to each other.

The invention also concerns an injection moulding press.

A further subject of the invention is a connector cable equipped with at least one overmoulded end.

The present invention provides numerous advantages.

The presence of means for keeping both ends of the cable being manufactured in a certain position in all the stations allows all the steps to be automated and to carry out the testing step directly on the manufacturing apparatus. In fact, especially in the case of electric cables production, by having both the ends available in a well-defined position once the moulding is made, it is possible to proceed with automatic testing by means of contacts placed in a corresponding position with respect to the position of the two ends, and thus proceed with checking the functioning of the cable by closing the electrical circuit.

Secondly, the adoption of a rotating press in which there is a corresponding injector that rotates with the mould itself allows the moulding step to be simplified because it allows the autonomous moulding process of each individual cable, eliminating the problems of grouping and successive singling out of the cables, typical of multi-impression moulding apparatuses. Furthermore, the presence of a plurality of small and light single moulds, in other words moulds with just one cavity or impression, allows the possibility of independently changing each single mould, by hand and without lifting equipment, thereby achieving high versatility for the apparatus since, by changing moulds, it is possible to use different impressions on the same rotatable platform.

This makes it possible to differentiate the moulding operation of the thermoplastic material; for example, it is possible to use different materials (using different polymers or different colours) and mould different quantities of materials in different moulds. With the invention, it is possible to produce cables with differently overmoulded heads and tails on the same apparatus, such as a socket and a plug for example, obtaining finished and already tested products in output from the apparatus.

BRIEF DESCRIPTION OF DRAWINGS

Further advantages shall be evident from the following description and enclosed drawings provided for illustrative and non-limitative purposes, where.

DESCRIPTION OF PREFERRED EMBODIMENTS

Figure 1:
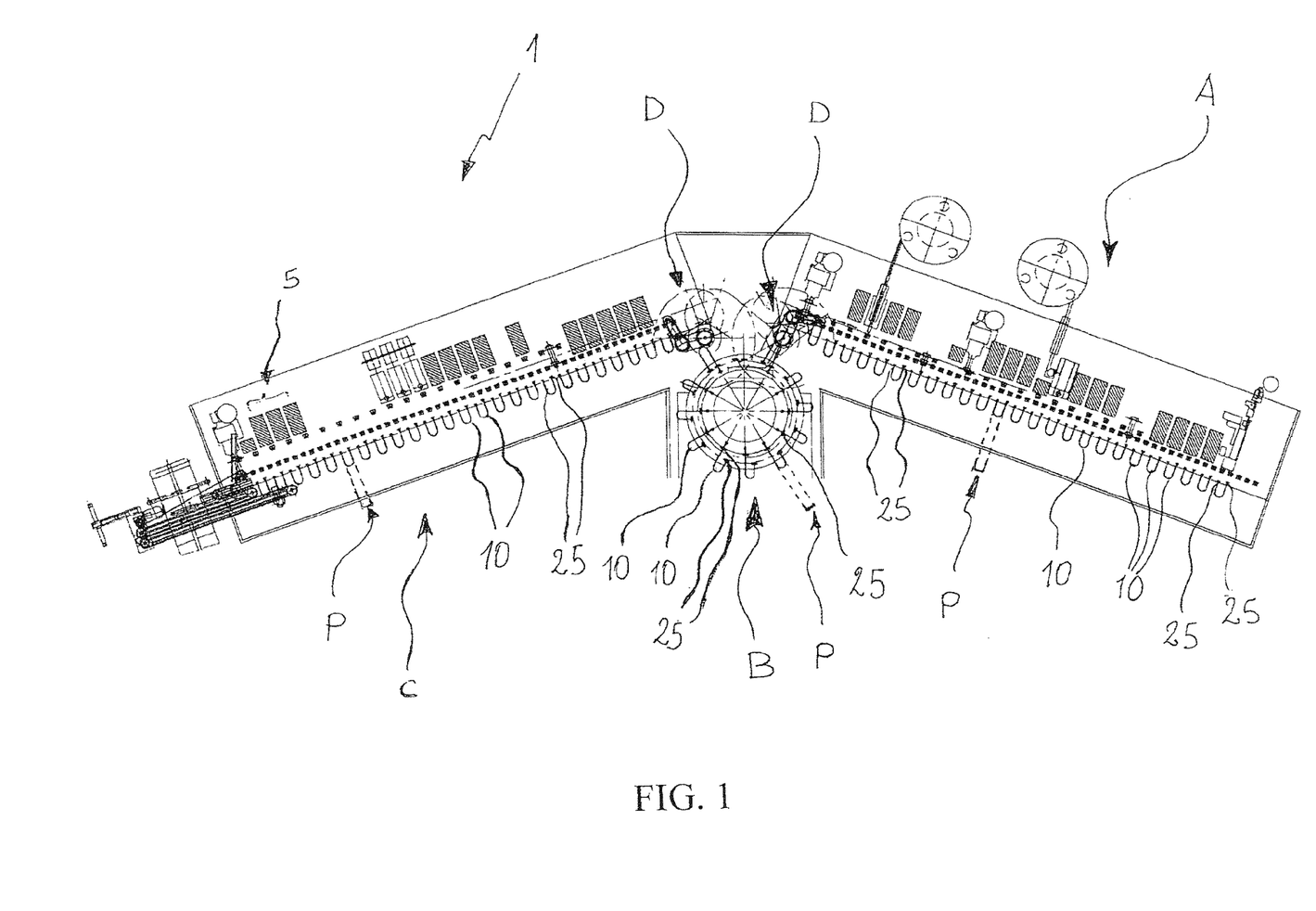
FIG. 1 is a schematic plan view of the apparatus according to the present invention.

FIG. 1 shows a partial schematic and plan view of a possible embodiment of the apparatus 1 of production (overmoulding) of elongated and flexible elements 10, preferably electric cables, comprising a first section A for the preparation of at least one of the ends of the cables, a moulding section B by means of which the thermoplastic material is injected over at least one end of the cable and a section C in which further processing is carried out on the end not processed in section A. The apparatus 1 according to the present invention is characterized in that it also comprises means for testing the cables 10 prior to their output from the apparatus, retaining means for both ends of the cable in all of the processing stations and means for moving said ends from the retaining means of one section to the retaining means of the next section.

As stated, the apparatus according to the present invention is used to overmould the ends of connection cables, electric or otherwise, and in particular to overmould plugs, sockets, connectors and similar elements to one end of a plurality of electric cables, represented in a simplified manner in FIG. 1 by a U shape and identified by reference numeral 10.

In the feed section A, one or both of the ends of the electric cables are prepared for moulding and, in particular, the inserts of sockets or connectors are connected to the conductor wires that project from inside the cables.

In the moulding section B, which will be described in greater detail hereunder with reference to FIGS. 2-6, the thus prepared cable ends are placed in the moulds and subjected to injection of the thermoplastic material, which embeds the insert and solidifies to form the body of the plug or electrical connector.

After moulding, the cables are checked and tested in the output section C. If required, the end not moulded in B is further processed in C. In any case, means for testing the finished cables are present, these means being referred to with numeral 5.

In the case of overmoulded terminals, sockets and connectors on electric cables, testing envisages a step in which both ends of the processed cable are placed in contact with conductors by which electric current is supplied to allow checking the closure of the electrical circuit and therefore the correct functioning of the cable.

The apparatus according to the present invention comprises means for retaining and keeping both cable ends in a preset position in all the stations of the apparatus, even when only one of the ends is processed, and therefore in all the steps of the manufacturing process: from the feed station for preparation of the cable ends, during moulding and in the final testing step. Having both cable ends in a preset position during the entire process and in all the stations of the apparatus, advantageously allows the speed of manufacture to be increased and to automate the process with a plurality of robots D, or equivalent automated means, which move the cables from one section to another of the apparatus.

In fact, by always having both ends of the cables 10 in a reciprocal preset position kept the same in all the sections A, B and C of the apparatus, there is the possibility of taking, transporting and releasing the cables during all the steps of the process.

As shown in FIG. 1, the two ends of each cable 10 are kept at a constant preset distance P in all steps of the manufacturing process.

In particular, it should be noted that the apparatus according to the present invention allows the testing of cables to be carried out automatically and rapidly at the end of the process of overmoulding terminals, plugs and connectors on one or both ends of the cables.

In fact, contrary to what happens in known apparatuses, the presence of means that allow the cable ends to be kept in a preset position guarantee the possibility of carrying out cable testing totally automatically.

More in detail, to carry out cable testing, it is necessary to connect the cable ends to the testing apparatus; in particular, when dealing with the testing of electric cables, the processed cable ends must be connected to two electric contacts that allow closure of the circuit and therefore to check that the cable works. The means of testing 5 are known art.

In section C of the apparatus according to the present invention, the cables are subjected to testing in 5 and are connected to two electric contacts that are placed in opposite and corresponding positions with respect to the two processed cable ends that, as has been said, are kept in a preset position by appropriate means.

Figure 3:
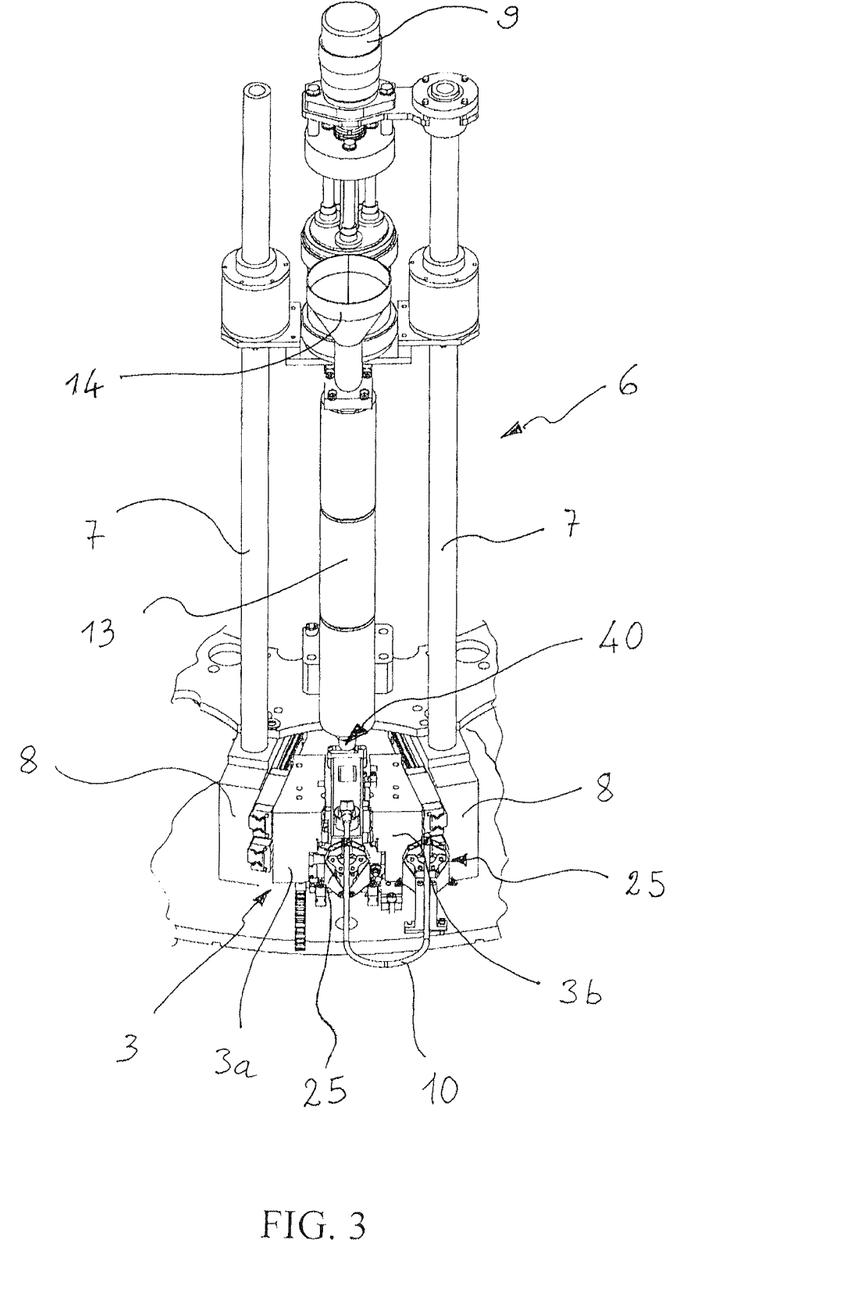
FIG. 3 shows a mould and the associated injector of the moulding station in detail.
Figure 4:
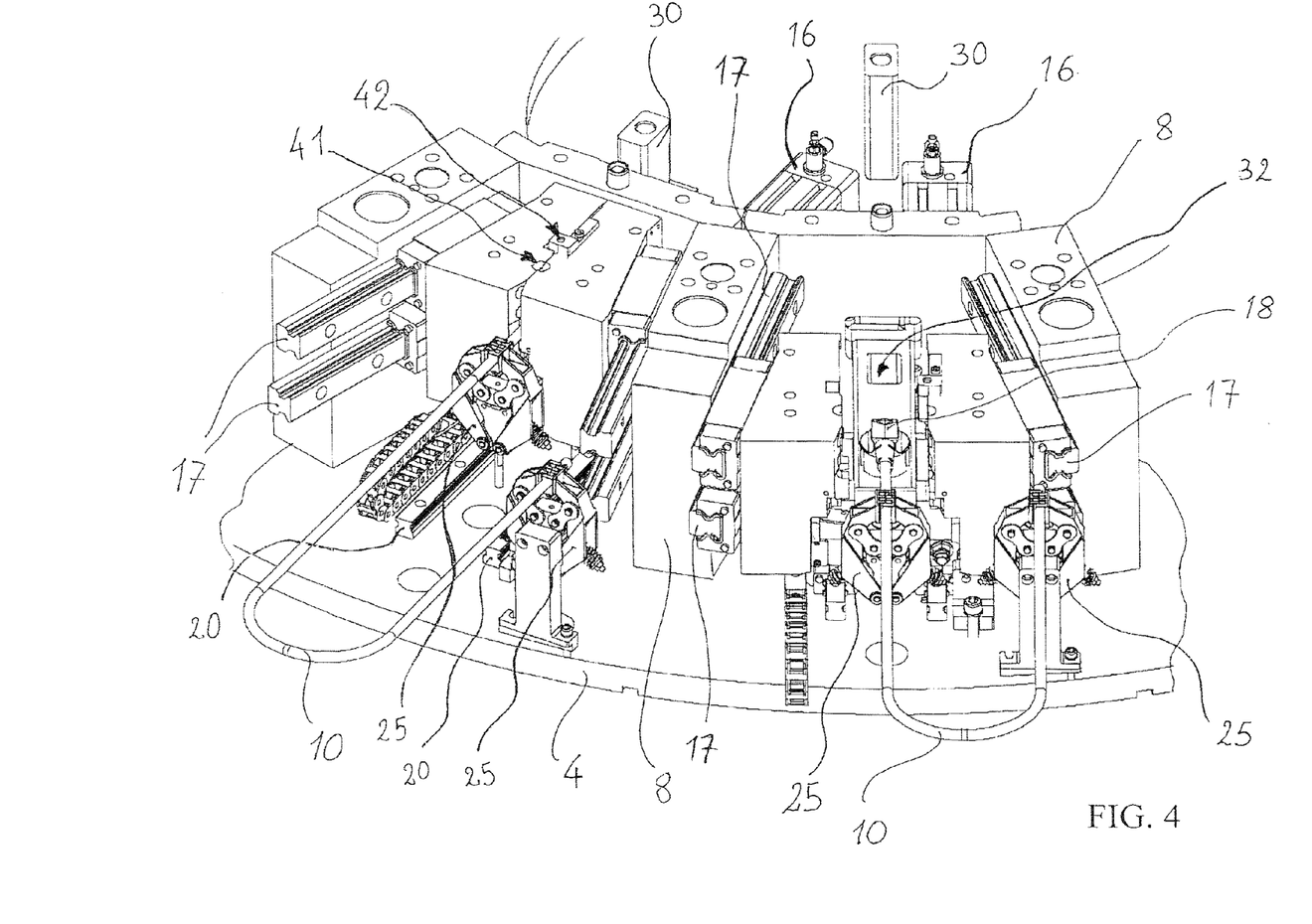
FIG. 4 shows two moulds of the moulding station in detail in the open position and in the closed position.
Figure 5:
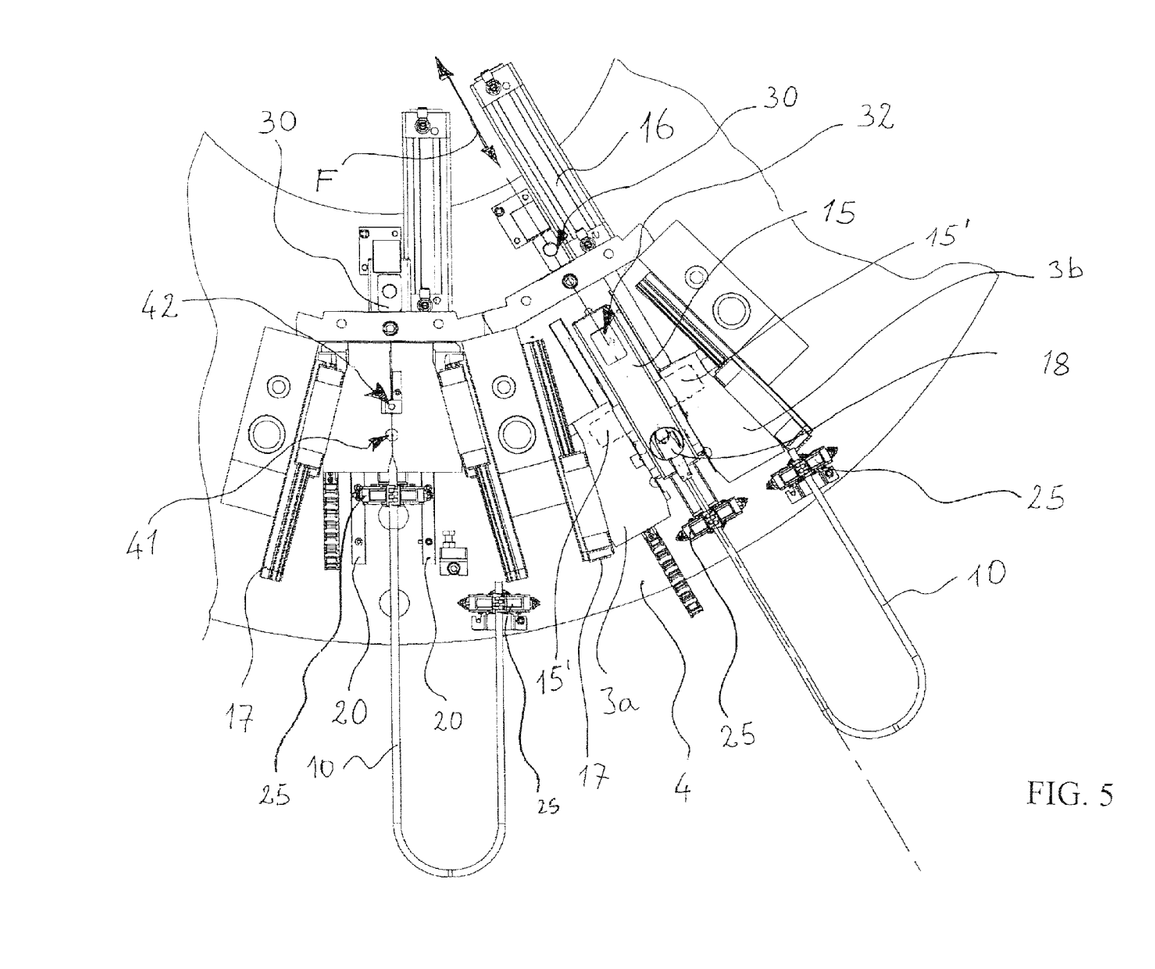
FIG. 5 is a top view of the moulds in FIG. 4.

Said retaining means both cable ends in a preset position comprise a pair of grippers 25, better shown in FIGS. 3-5, the opening, closing movement of which is preferably controlled automatically, and inside which the ends of the cables 10 are held.

The moulding section B of the apparatus comprises a rotating carousel structure 2 equipped with a plurality of presses for the injection of thermoplastic material into the moulds 3 that are arranged along a circumference.

Figure 2:
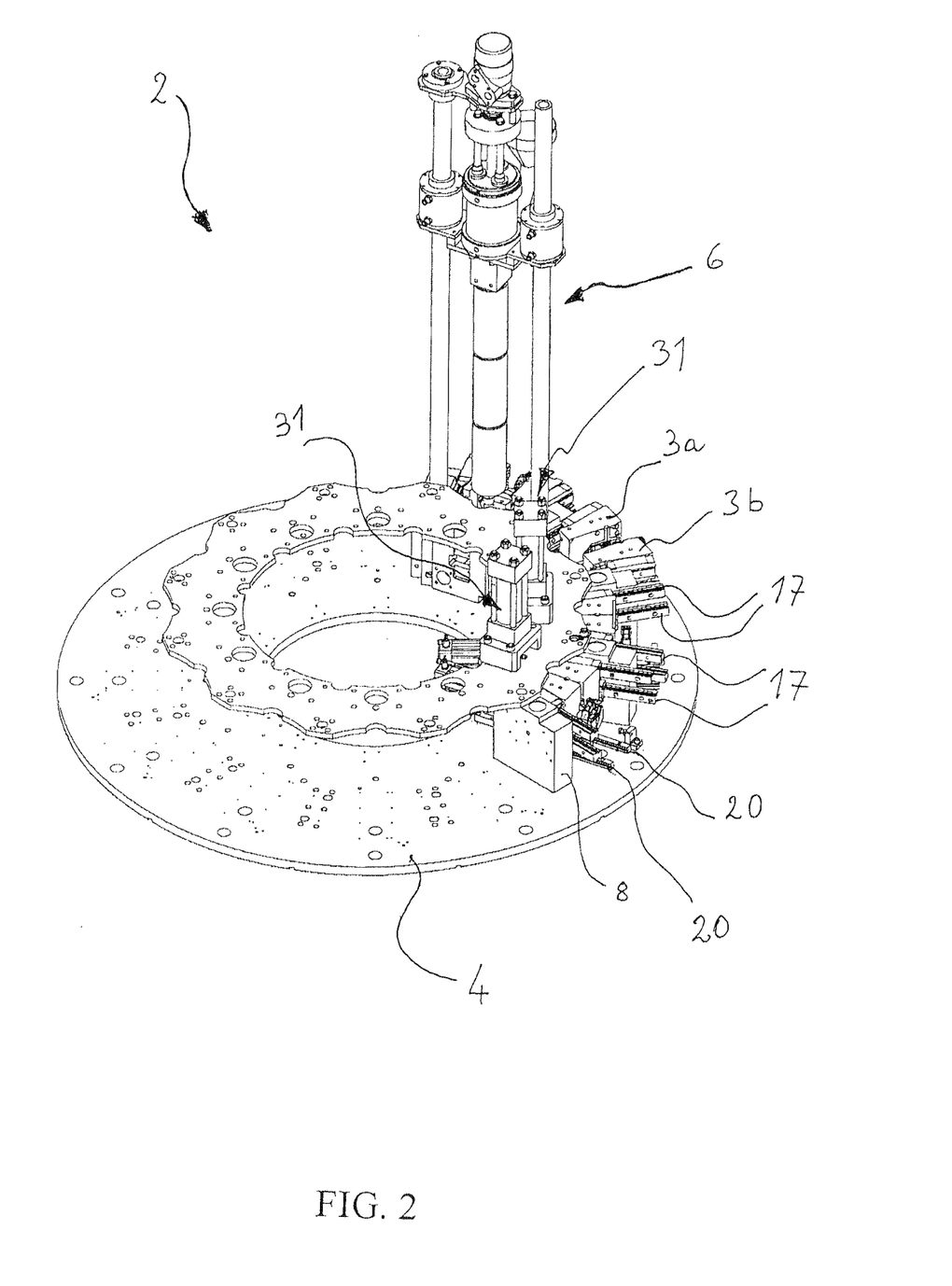
FIG. 2 is a partial perspective view of the moulding station of the apparatus according to present invention.

FIG. 2 shows a partial perspective view of the rotatable structure 2 of the moulding section B of the apparatus, where only one injector 6 is shown for greater clarity.

As stated, moulds 3 are arranged along a circumference of a rotatable platform or surface 4.

Preferably, moulds 3, shown in detail in FIGS. 4 and 5, are mono-impression or single cavity, that is to say they are able to accept only one end of a cable at a time and to mould only one piece at a time, so as to have a smaller quantity of thermoplastic to be cooled and be able to speed up manufacturing times.

According to the present invention, an injector 6 is present for each mould 3, the injector also being mounted on the platform 4, so that the mould and the corresponding injector are rotationally translated together by the platform 4 along a circumference.

Figure 6:
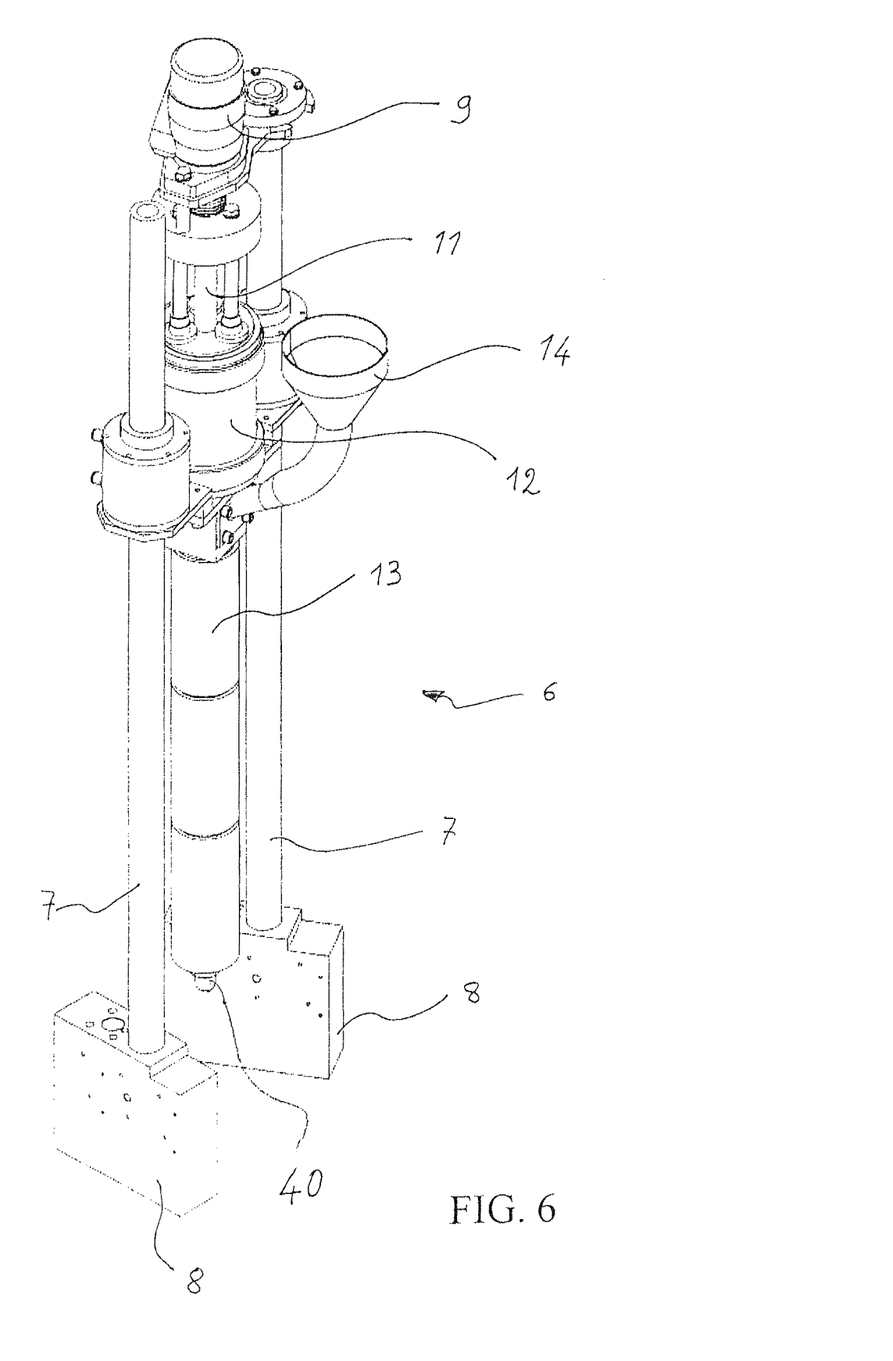
FIG. 6 is a schematic and perspective view of an injector according to the present invention.

As shown in FIGS. 2, 3 and 6, the injector 6 is mounted vertically on platform 4 with the support of two columns 7 and bases 8. The injection unit, or injector 6, comprises an injection screw 11, a screw control motor 9, an injection cylinder 12 and a plasticization cylinder 13 in a known manner. It is a characteristic of the present invention that, as shown, the motor 9, screw 11, cylinder 12 and cylinder 13 are coaxial, i.e. concentric. A feed hopper 14, connected in a known manner to the mouth of the plasticization cylinder 13, is associated with each injector 6. The hopper 14 therefore moves with its own injector and receives thermoplastic material or thermoplastic granules from a fixed container-distributor (not shown) below which the platform 4 is brought upon completion of each revolution of the platform around its axis.

The mould 3 according to the present invention is formed by at least two vertically placed half-moulds 3a and 3b and by a transport element (or carrier) 15 that engages the two half-moulds to translate them in a radial direction on the platform 4. As can be seen in greater detail in FIG. 4, the half-moulds 3a and 3b open vertically and are engaged by the transport element 15, controlled by an actuator 16 and which can reciprocate along a radial direction indicated by arrow F.

In the embodiment shown, the carrier element 15 also has the function of a third piece of the mould, in fact, the carrier element has two seats for housing the metal pins of the skeleton, or insert, of plug 18 that must be overmoulded with the thermoplastic material; the corresponding portion of the upper face of element 15 thus acts as a third half-mould, or as an insert to define the moulding cavity.

The two half-moulds 3a and 3b are mounted on pairs of guides 17 fixed to the sides of the bases 8 and oriented with them in diverging directions to the outside of the platform 4. The opening and closing of the mould 3 takes place following the translation of the half-moulds 3a and 3b along the guides 17 by means of the carrier 15. During opening, the carrier 15 moves in a substantially radial direction and pushes the two half-moulds towards the outside. The two half-moulds are constrained by the carrier 15 such that they can move transversely with respect to it, by means of two housings for accepting two plugs 15' (FIG. 5) for example, and move apart from each other.

The moving apart is guaranteed by the fact that the half-moulds are slidingly constrained by the guides 17 fixed to the platform 4 by means of the shoulders 8.

In other words, the opening and closing movement of the half-moulds 3a and 3b is obtained by the radial displacement of the transport element 15, controlled by the actuator 16, which is preferably of the pneumatic type.

In fact, the two half-moulds 3a and 3b are constrained on the transport element 15 by means of the two plugs 15' and so operating the actuator 16 that allows displacement of the carrier 15 in a radial direction (arrow F in FIG. 5), it is possible to open and close the mould 3 following the movement of the two half-moulds 3a and 3b along the guides 17.

Preferably, the displacement of the transport element 15 takes place on two guides 20 constrained to the upper surface of the rotating platform 4 of the moulding section B. It should be noted that in FIGS. 4 and 5, in order to simplify and make clear the working of the moulding station according to the present invention, the two side by side moulds 3 are shown with one in the closed position (on the left) and the other (on the right) in the open position at the end of moulding and solidification of the thermoplastic material.

Each cable 10 is transported to the moulding section B by two grippers 25 that allow both ends of each cable 10 to be held in a certain position and at a preset reciprocal distance P.

More in detail, a gripper 25 holds the end of the cable undergoing moulding in correspondence to the two half-moulds 3a and 3b, while the other gripper 25 holds the second end of the cable, not processed, close to the mould and, in any case, in a certain and preset position with respect to the other end.

As shown in FIGS. 4 and 5, the gripper 25 that holds the end of the cable to be processed in the two half-moulds 3a and 3b follows the opening and closing displacement of the mould 3 in the radial direction so as to support and adequately retain the end of the cable throughout the moulding process, from when it is placed inside the mould until it is extracted from it after solidification of the thermoplastic material.

The transport element 15 of the two half-moulds 3a and 3b also comprises means for locking itself in the moulding position, or rather the closed position. In fact, as can be seen in FIGS. 3-5, in correspondence to its back end (the end closest to the centre of the rotating moulding station), it is provided with a seat 32 shaped to accept a latch 30 that is mobile in a vertical direction with respect to the plane identified by the rotating platform 4.

More in detail, the latch 30 is operated by means of a hydraulic actuator 31 (shown in FIG. 2) and, when the mould is in the closed position, it is vertically translated to an engagement position with the seat 32 of the transport element 15.

In so doing, once the closed position of the mould 3 is reached, displacement of the carrier element 15 in the radial direction is prohibited, thus preventing the possible reopening of the mould during the pressurized injection of the thermoplastic material inside it.

After solidification of the thermoplastic material, the latch 30 is translated vertically upwards by the hydraulic actuator 31, so as to leave the position of engagement with the seat 32 of the carrier 15 and allow the displacement of the latter by means of the pneumatic actuator 16 to reopen the mould 3.

In moulding section B according to the present invention, the means of locking the mould in the closed position, namely the hydraulic actuator 31, are advantageously separate from the means that allow the opening and closing movement, namely the pneumatic actuator 16.

This allows the quality and safety of the moulding step to be improved, avoiding that the pressure with which the thermoplastic material is injected inside the mould could cause its partial opening, or the moving apart of the two half-moulds, compromising the final quality of the processed cable.

Each mould 3 of the moulding section B is equipped with its own means for locking the mould in the closed position, preferably comprising a hydraulic actuator 31, and means for the opening and closing of the mould itself, preferably comprising a pneumatic actuator 16.

Furthermore, each mould 3 of the moulding station is provided with its own means of cooling; for example, the pipes for the transport of a coolant liquid, not shown in the enclosed figures, connected to both the half-moulds 3a and 3b.

Since the moulding section B is equipped with a plurality of moulds 3 placed in rotation on the platform 4, it is also equipped with means of known type, for example, a multi-passage coupling beneath the platform 4, for the distribution to each individual mould 3 of the air, water and coolant liquid respectively necessary for controlling the opening and closing, the holding in the closed position and the cooling of each mould.

The presence of a number of single-impression moulds 3, placed in rotation on a revolving surface 4 and each equipped with its own injector 6 of thermoplastic material, allows the speed and efficiency of the cable manufacturing process to be increased and, in particular, allows the problems encountered in apparatuses of known art, due to process idle times caused by the waiting necessary for solidification of the thermoplastic material, to be eliminated.

In fact, the solidification of the material takes place during the rotation of the mould and thanks to the cyclicity provided by the rotation of the moulds. More in detail, the press 2 of the moulding section B is equipped with 12 moulds and corresponding injectors. As approximately three seconds in total are necessary each cycle to carry out the automated cable loading and unloading operations, a total time of 36 seconds (12×3) for one revolution of the rotating table is obtained, a time that guarantees an ample margin for solidification of the thermoplastic material.

In other words, every three seconds, a processed cable is discharged from the apparatus and a mould becomes available for loading with a new cable.

In so doing, it is possible to carry out the continuous moulding of cable ends without having to wait the solidification time of the thermoplastic material before being able to load a new cable in the mould.

Obviously, depending on the size of the moulding section in terms of number of moulds and corresponding injectors installed and depending on the solidification time of the thermoplastic material utilized, it is possible to further decrease the manufacturing cycle time by increasing the number of cables that can be processed.

The steps of the manufacturing process for the ends of electric cables according to the present invention and, in particular, the overmoulding of a plug 18 on one end of a plurality of cables 10 shall now be described.

The cables 10 are loaded in the first section A of the apparatus by, for example, a robot arm (not shown), and are transported and held by means of grippers 25.

Both ends of each cable 10 are kept in a preset reciprocal position.

In the first section A, one end of each cable 10 is prepared for the subsequent overmoulding of thermoplastic material; in particular, the metal insert, or rather the metal pins of the plug that it is intended to make are connected to the electrical wires at the end of the cable.

The second end of the cable is transported and held in a gripper 25 at a preset distance P from the first end.

The cables 10 are subsequently moved by automated means, such as a robot arm D for example, from the retaining means, namely the grippers 25, of the first section A to the retaining means of the moulding section B.

The end to be overmoulded of each cable 10 arriving from the first section A is placed inside the mould 3 in the open position. (Note that a mould in the open position is shown in FIG. 3 and in the right-hand part of FIGS. 4 and 5)

The pins of the plug insert are inserted in the specially provided seats, not shown, of the transport element 15 and the end of the cable is held by a gripper 25.

The steps of overmoulding the thermoplastic material are carried out during the rotation of the platform 4, while the second end of the cable that is not processed is held in a gripper 25 at a preset distance P from the first end placed inside the mould 3.

The mould is then closed by means of the actuator 16, which allows translation of the transport element 15 in a radial direction (arrow F in FIG. 5), which causes the half-moulds 3a and 3b to slide on the guides 17.

In so doing, the mould 3 is closed (position shown in the left-hand part of FIGS. 4 and 5) and locked in this position by means of the vertically downwards translation of the latch 30, controlled by the hydraulic actuator 31, which allows the engagement position with the seat 32 of the transport element 15 to be reached to block movement of the latter.

Then, the injector 6, previously loaded with thermoplastic material, is translated vertically downwards along the columns 7 and brought closer so that the nozzle 40 makes contact with the hole 41 for the passage of thermoplastic material into the mould 3, which is in the closed position.

The thermoplastic material is injected under pressure through the nozzle 40.

It should be noted that to avoid the possibility of the plug insert moving during injection of the thermoplastic material inside the mould 3, the mould 3 is equipped with a further passage 42 (FIG. 4) for the insertion of a pin, not shown, and preferably located on the injector 6 close to the nozzle 40.

In so doing, when the injector 6 is translated downwards along the columns 7 and the nozzle 40 makes contact with hole 41 for injecting the thermoplastic material, the pin also enters in the mould 3 and holds the plug's insert between itself and the upper surface of the transport element 15, avoiding possible movement due to pressure.

As stated, the solidification of the material takes place during the rotation of the moulding section B and ends before the mould reaches the robot D employed to transfer the cables to the output section C of the apparatus.

In other words, the cyclicity given to the apparatus allows uninterrupted, continuous moulding to be carried out. In fact, the speed of rotation of the platform 4 is such that all the steps of the moulding process take place between the position in which the first robot D loads the cables in the moulds of the first section A and the position in which the second robot D transfers the cables, having the plug already overmoulded and solidified on one end, to section C for any finishing and testing.

Before the mould 3 reaches the position of the second robot D for removal of the moulded plug, the mould 3 is opened in the moulding section B to allow the cable to be transferred.

In order to do this, the latch 30 is raised and the actuator 16 is operated so as to cause translation of the transport element 15 in a radial direction towards the outside of the moulding section B.

In so doing, the two half-moulds 3a and 3b, constrained on the transport element 15 by the plugs 15', move in a corresponding manner along the divergent guides 17 and reach the open position (the position shown in the left-hand part of FIGS. 4 and 5).

The robot D allows ends of the cable 10 to be transferred from the retaining means 25 of the moulding section B to those of section C of the apparatus, always keeping both cable ends in the present position.

The mould 3 is thus ready for being loaded with a new cable 10 end arriving from the first section A, allowing overmoulding to be carried out continuously and without interruption.

The cables 10 transferred to section C of the apparatus can be easily tested using means 5, as the two ends are kept in a known and preset reciprocal position.

Both ends of each cable can be overmoulded simultaneously in the apparatus according to the present invention.

The first and the second ends of the cable are overmoulded in two moulds side by side in the moulding section B.

This versatility of the apparatus results from the possibility of easily and rapidly changing the moulds in the moulding section. In fact, they are very small and can be easily removed and installed by virtue of the previously described special opening-closing apparatus with which they are equipped.

Figure 7:
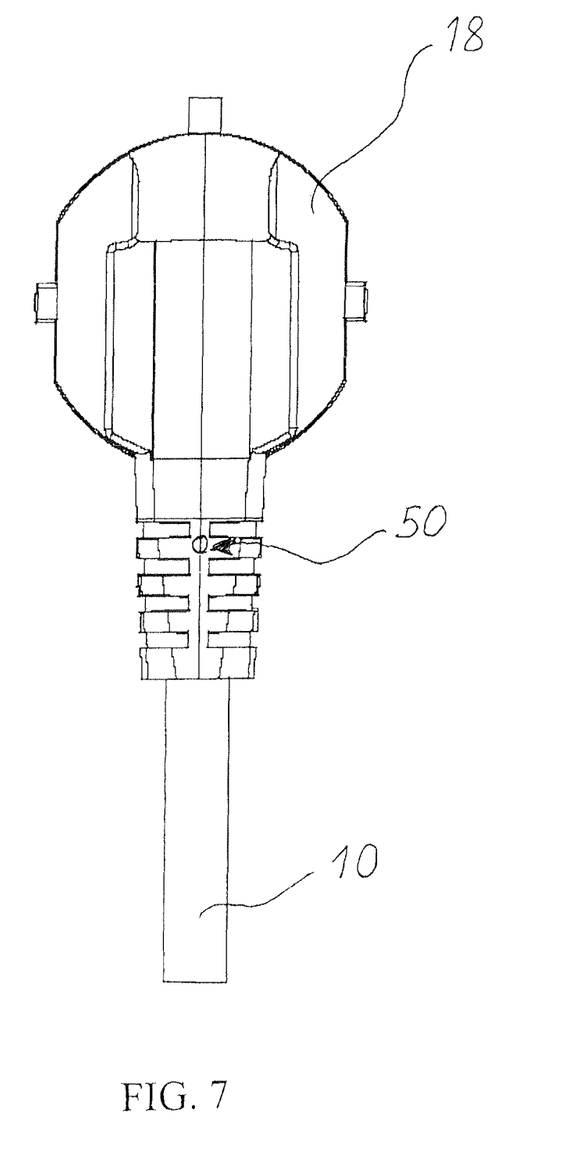
FIG. 7 is a top view of the overmoulded end of a connection cable obtained by the process according to the present invention.

FIG. 7 shows a connection cable fitted with a plug at one end, overmoulded in accordance with the above-described process and that, as can be seen, has only one injection point 50 placed in correspondence to centre line of the mould 3 on the tang, i.e. on the tail end of the plug. This characteristic, namely just one injection point, positioned on the centre line of the mould and on the tail of the plug, is typical of products obtained by using the present process and with the moulds of the present invention, and differentiates them from products obtained using traditional processes and apparatuses.

The invention claimed is:

1. An apparatus for manufacturing the ends of electric cables, comprising:
   a moulding section for injection moulding on at least one of said ends, a first section configured to apply at least one electrical connection element to said at least one end of the cable;
   a testing apparatus configured to test said cable prior to output of said cable from the apparatus;
   at least one gripper configured to retain both ends of the cable in all of said manufacturing sections and a movement member configured to move said ends from the at least one gripper of one section to the at least one gripper of the next section; and
   wherein said moulding section comprises a plurality of moulds and an injector for each mould of said plurality of moulds and said corresponding injectors being mounted on a platform with which they are rotatable.

2. The apparatus according to claim 1, wherein each mould each have a single cavity and the at least one gripper is adjacent to said mould of the plurality of moulds, such that each of the mould of the plurality of moulds and the at least one gripper together retain the end of the cable.

3. The apparatus according to claim 2, wherein each mould comprises two half-moulds slidable on guides fixed to said platform and divergently oriented from each other, towards the outside of said platform, to perform the opening and closing of each mould following the translation of the half-moulds along said guides.

4. The apparatus according to claim 3, wherein each mould further comprises a moving element for the two half-moulds, said moving element being configured to lock in the moulding position and to retain the end of the cable inside the closed mould, a portion of said moving element forming part of the wall of the cavity of the mould.

5. The apparatus according to claim 1 wherein said injector comprises a plasticizing cylinder, an injection cylinder, an injection screw and a control motor for said injection screw, said plasticizing cylinder, injection cylinder, injection screw, and control motor being arranged coaxially with respect to each other.

6. A process for manufacturing the ends of electric cables on an apparatus according to claim 1, comprising, a first step of application of electrical connection elements to said at least one end of the cable and a further step in which further electrical connection elements are applied to the remaining end of the cable, and     a step of injection moulding on at least one of said ends in a moulding section that comprises a plurality of moulds and an injector for each mould of the said plurality of moulds and said corresponding injectors being mounted on a platform with which they are rotatable, wherein each end of the cable is held in a known position by at least one gripper in all of the manufacturing steps, so as to be able to automatically move said ends from the at least one gripper of one section to the at least one gripper of the next section and in that said cable is tested before said cable leaves the manufacturing apparatus.

7. The process according to claim 6, in which said step of injection moulding comprises the steps of: moving the ends of said cable from the at least one gripper of the previous section to the moulding section, holding one end of said cable in the mould and the remaining end in at least one gripper external to at least one mould of the plurality of mould, closing at least one of the mould and injecting a sufficient quantity of thermoplastic material into said at least one mould, transporting said closed mould together with the corresponding injector from the moulding position to an opening position, and opening said mould when said at least one mould is positioned in correspondence of the next manufacturing section.

8. The process according to claim 7, in which at least one further injection step in a further mould is carried out during transport.

9. The process according to claim 6, wherein at least one mould of the plurality of mould is opened and closed by translation of said the at least one mould on mutually divergent guides fixed to said rotating platform, said translation being operated by a translation element and a corresponding actuator.

10. The process according to claim 6, wherein said at least one the mould of the plurality of mould is kept closed during the moulding step by a locking element of a movement element of the mould, said locking element acting vertically on said movement element of the mould.

11. The process according to claim 6, wherein the two ends of said cable are moulded in two separate moulds on said rotating platform.

12. The apparatus according to claim 1 further comprising a second section configured to apply at least one further electrical connection element to the remaining end of the cable.

\* \* \* \* \*